(12) United States Patent
Kim et al.

(10) Patent No.: US 7,656,017 B2
(45) Date of Patent: Feb. 2, 2010

(54) INTEGRATED CIRCUIT PACKAGE SYSTEM WITH THERMO-MECHANICAL INTERLOCKING SUBSTRATES

(75) Inventors: Hyun Joung Kim, Ichon-si (KR); Taeg Ki Lim, Icheon (KR); Ja Eun Yun, Busan (KR)

(73) Assignee: Stats Chippac Ltd., Singapore (SG)

( * ) Notice: Subject to any disclaimer, the term of this patent is extended or adjusted under 35 U.S.C. 154(b) by 37 days.

(21) Appl. No.: 11/953,340

(22) Filed: Dec. 10, 2007

(65) Prior Publication Data

US 2008/0142943 A1 Jun. 19, 2008

Related U.S. Application Data

(60) Provisional application No. 60/870,467, filed on Dec. 18, 2006.

(51) Int. Cl.
*H01L 23/02* (2006.01)
(52) U.S. Cl. .................. 257/686; 257/E23.023; 257/777; 257/785; 438/109
(58) Field of Classification Search ......... 257/678–733, 257/787–796, E23.001–E23.194
See application file for complete search history.

(56) References Cited

U.S. PATENT DOCUMENTS

| | | | |
|---|---|---|---|
| 6,007,349 A | 12/1999 | Distefano et al. | |
| 6,188,138 B1 | 2/2001 | Bodö et al. | |
| 6,262,477 B1 | 7/2001 | Mahulikar et al. | |
| 6,436,734 B1 | 8/2002 | Lin | |
| 6,448,108 B1 | 9/2002 | Lin | |
| 6,469,374 B1 | 10/2002 | Imoto | |
| 6,611,012 B2 | 8/2003 | Miyamoto et al. | |
| 6,777,794 B2 | 8/2004 | Nakajima | |
| 2003/0098703 A1* | 5/2003 | Akram | 324/760 |
| 2005/0040508 A1* | 2/2005 | Lee | 257/686 |
| 2006/0210769 A1* | 9/2006 | Swindlehurst et al. | 428/141 |
| 2007/0096312 A1 | 5/2007 | Humpston et al. | |
| 2007/0187818 A1* | 8/2007 | Lyne | 257/734 |
| 2007/0197099 A1 | 8/2007 | DiStefano | |
| 2008/0253095 A1* | 10/2008 | Baraton et al. | 361/752 |

* cited by examiner

*Primary Examiner*—Fernando L Toledo
*Assistant Examiner*—Mamadou Diallo
(74) *Attorney, Agent, or Firm*—Mikio Ishimaru

(57) ABSTRACT

An integrated circuit package system includes providing a plurality of substrates; inserting a receptor in one of the substrates, the receptor held in and not extending through the one of the substrates; inserting a conductive post in another of the substrates; mounting the one of the substrates and the another of the substrates over one another with the conductive post engaging the receptor to thermally interlock without a separate bonding material; and mounting an integrated circuit mounted on the one of the substrates or the another of the substrates.

20 Claims, 6 Drawing Sheets

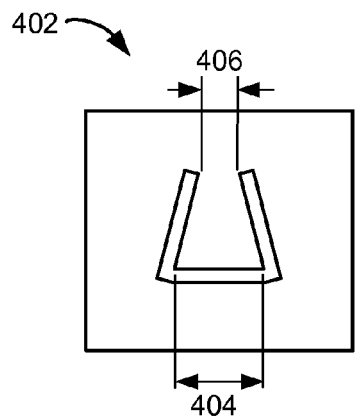
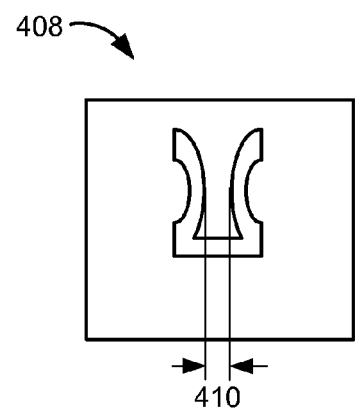
FIG. 4A  FIG. 4B
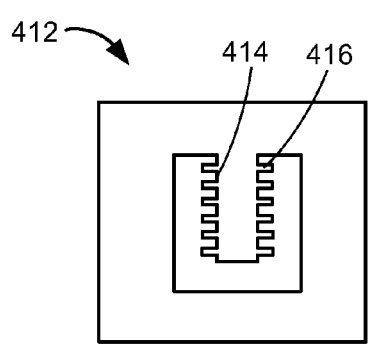
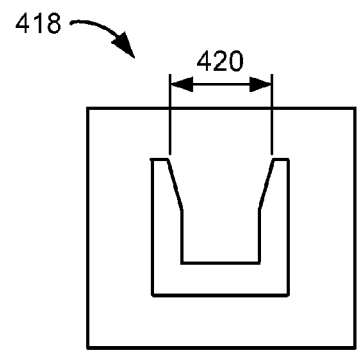
FIG. 4C  FIG. 4D
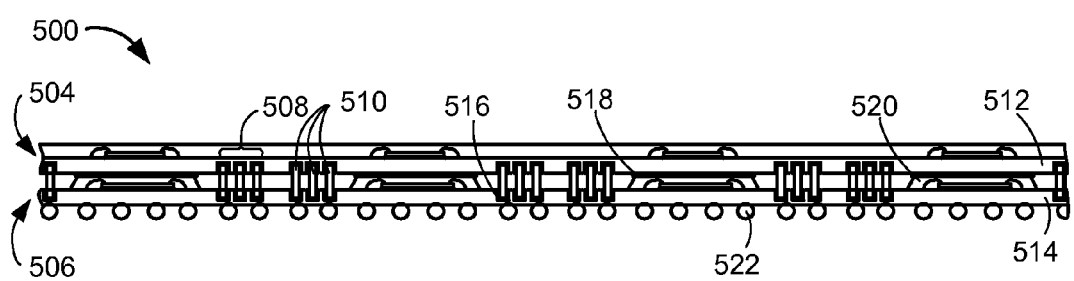
FIG. 5

INTEGRATED CIRCUIT PACKAGE SYSTEM WITH THERMO-MECHANICAL INTERLOCKING SUBSTRATES

CROSS-REFERENCE TO RELATED APPLICATION

This application claims the benefit of U.S. Provisional Patent Application Ser. No. 60/870,467 filed Dec. 18, 2006.

TECHNICAL FIELD

The present invention relates generally to integrated circuit package systems, and more particularly to a system for integrated circuit package systems having stacked packages.

BACKGROUND ART

To interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density.

However, integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of one or more substrates onto each of which one or more integrated circuit components is directly attached. Such multi-chip packages have been found to increase integrated circuit density and miniaturization, improve signal propagation speed, reduce overall integrated circuit size and weight, improve performance, and lower costs—all primary goals of the computer industry.

Among other problems encountered with these multi-chip and multi-chip modules is connecting different packages together to form a single module. There is design limitations presented by package stacks as well. In many of the stacked structures, the top package is not able to have system interconnects in the center as this area is usually consumed by the plastic package cover of the lower device. In the push for more integrated function, this limitation may stop a design from using the package type.

Thus, a need still remains for improved packaging methods, systems and designs. In view of the shrinking size of consumer electronics and the demand for more sophisticated functions in the restricted space, it is increasingly critical that answers be found to these problems. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes providing a plurality of substrates; inserting a receptor in one of the substrates, the receptor held in and not extending through the one of the substrates; inserting a conductive post in another of the substrates; mounting the one of the substrates and the another of the substrates over one another with the conductive post engaging the receptor to thermally interlock without a separate bonding material; and mounting an integrated circuit mounted on the one of the substrates or the another of the substrates.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIGS. 4A-4D are cross-sectional views of different receptors, which may be used in various embodiments of the present invention;

FIG. 5 is a cross-sectional view of an integrated circuit package system in a second embodiment of the present invention;

BEST MODES FOR CARRYING OUT THE INVENTION

Figure 1:
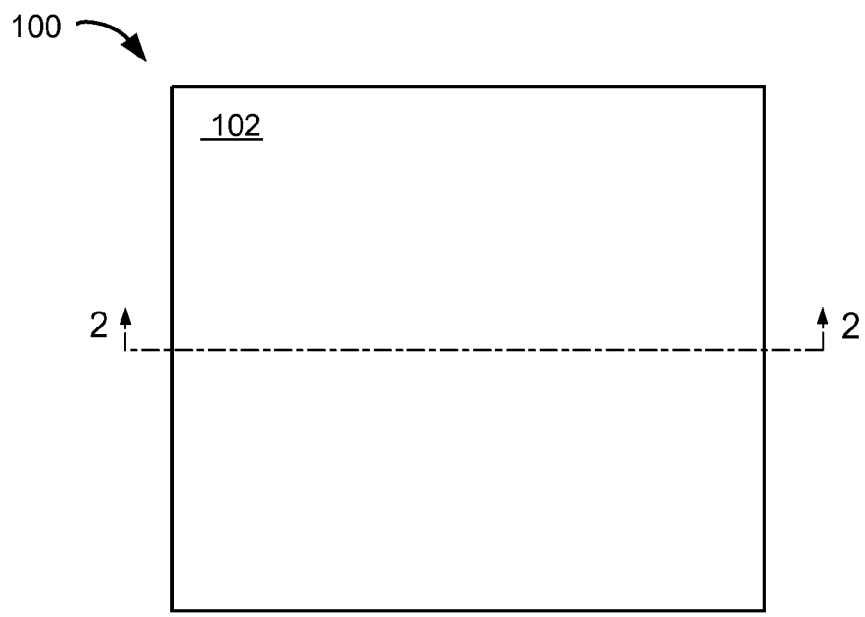
FIG. 1 is a top view of the integrated circuit package system in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. The terms first, second, and third embodiments are used merely as a convenience and do not have any other significance.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention, as appropriate and as evident from context. The term "processing" as used herein includes stamping, forging, patterning, exposure, development, etching, cleaning, and/or removal of the material or laser trimming as required in forming a described structure.

Referring now to FIG. 1, therein is shown a top view of an integrated circuit package system 100 in an embodiment of the present invention. The top view depicts a top encapsulation 102 of the integrated circuit package system 100. For illustrative purposes, the integrated circuit package system 100 is shown in a square geometric configuration, although it is understood that the integrated circuit package system 100 may formed in other geometric shapes, such as a rectangular configuration.

Figure 2:
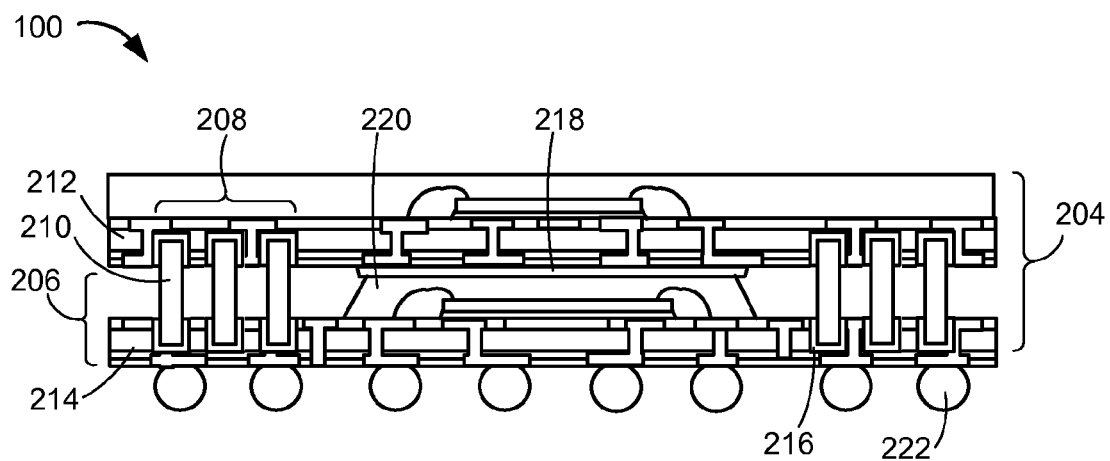
FIG. 2 is a cross-sectional view of an integrated circuit package system along a line 2-2 of FIG. 1.

Referring now to FIG. 2, therein is shown a cross-sectional view of the integrated circuit package system 100 along a line 2-2 of FIG. 1. The integrated circuit package system 100 includes a top integrated circuit package system 204, such as a packaged device with one or more integrated circuit or flip chip, mounted over a bottom integrated circuit package system 206, such as a packaged device with one or more integrated circuit or flip chip. The integrated circuit package system 100 includes thermo-mechanical interlocking substrates with an interconnect system 208. The interconnect system 208 includes conductive posts 210 locking a top substrate 212 of the top integrated circuit package system 204 and a bottom substrate 214 of the bottom integrated circuit package system 206.

Thermal expansion mismatch between the conductive posts 210 of the top integrated circuit package system 204 and nominal receptors 216 of the bottom integrated circuit package system 206 forms mechanical bonding between the conductive posts 210 and the nominal receptors 216. For illustrative purposes, the integrated circuit package system 100 is described with the conductive posts 210 included with the top integrated circuit package system 204, although it is understood that the conductive posts 210 may not be included with the top integrated circuit package system 204. For example, the conductive posts 210 may be inserted into both the top substrate 212 and the nominal receptors 216 in the bottom substrate 214 with the conductive posts 210 forming mechanical and electrical connections with both by thermal expansion.

The nominal receptors 216 are shown not traversing the through the bottom substrate 214. An adhesive 218, such as a film adhesive, attaches a bottom encapsulation 220, such as an epoxy molded compound, of the bottom integrated circuit package system 206 and the top substrate 212. External interconnects 222, such as solder balls, may be attached to the bottom of the bottom substrate 214 for connections to the next system level (not shown), such as a printed circuit board or another integrated circuit package system.

Figure 3A:
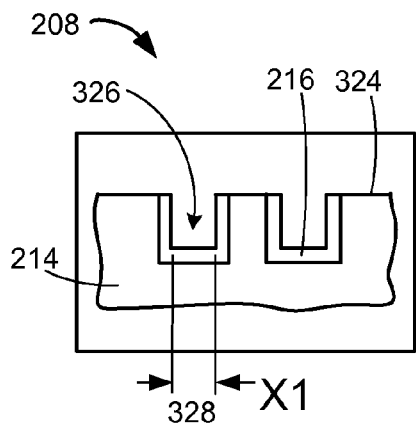
FIGS. 3A-3D are more detailed cross-sectional views of the interconnect system of the integrated circuit package system of FIG. 1.

Referring now to FIGS. 3A-3D, therein are shown more detailed cross-sectional views of the interconnect system 208 of the integrated circuit package system 100 of FIG. 1. FIG. 3A depicts a portion of the bottom substrate 214. A mounting side 324 of the bottom substrate 214 exposes the nominal receptors 216. Nominal openings 326 of the nominal receptors 216 in the bottom substrate 214 can be formed through a number of processes, such as the process of forming vias in a substrate. The nominal receptors 216 are preferably made from oxidation resistant conductive materials, such as gold. The nominal openings 326 of the nominal receptors 216 have a nominal opening diameter 328 denoted as "X1", for example at room temperature.

For illustrative purposes, the nominal receptors 216 are described with the nominal openings 326 having the nominal opening diameter 328, although it is understood that the nominal receptors 216 may have the nominal openings 326 in different geometric configurations. For example, the nominal receptors 216 may have the nominal openings 326 in a configuration of a square and the nominal openings 326 may be described with an opening width instead of the nominal opening diameter 328.

Figure 3B:
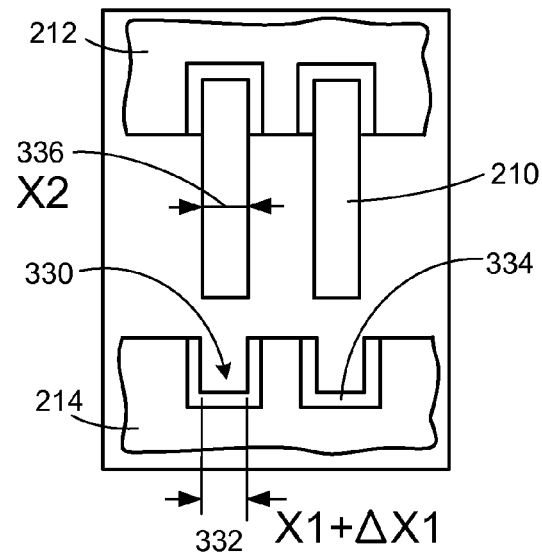

FIG. 3B depicts a portion of the top substrate 212 with the conductive posts 210 above the bottom substrate 214. The bottom substrate 214 undergoes heating to a sufficient temperature to achieve thermal expansion $\Delta X1$ of the nominal openings 326 of FIG. 3A to an expanded opening 330 having an insertion opening diameter 332. The heating process form expanded receptors 334 from the nominal receptors 216 of FIG. 3A. The conductive posts 210 have a post diameter 336 denoted as "X2". The conductive posts 210 are aligned over the expanded receptors 334. The insertion opening diameter 332 is denoted as "X1+$\Delta X1$".

For example, interactions with the polymeric substrate material of the bottom substrate 214 surrounding the nominal receptors 216 will make the expansion larger than standalone nominal receptors 216. A vacuum block (not shown) may be used to hold the bottom substrate 214 to minimize package warpage during heating. The bottom substrate 214 is heated to a sufficient high temperature, preferably higher than that used for reliability testing.

Figure 3C:
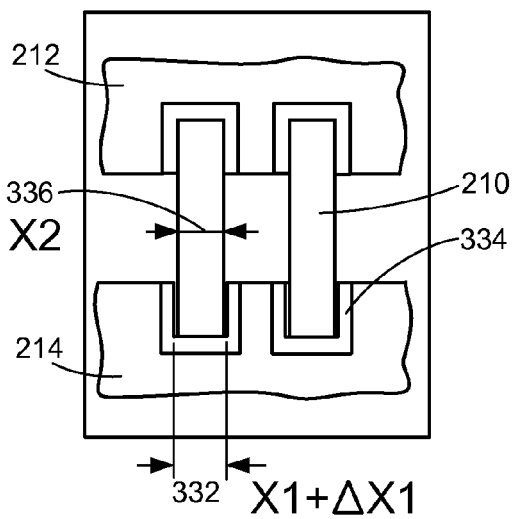

FIG. 3C shows mounting the top substrate 212 over the bottom substrate 214. The conductive posts 210 are inserted into the expanded receptors 334 of the bottom substrate 214 with the post diameter 336 less than the insertion opening diameter 332 or X2<X1+$\Delta X1$. A placement tool (not shown) may be air or water cooled to maintain a low temperature of the top substrate 212 and the conductive posts 210.

Figure 3D:
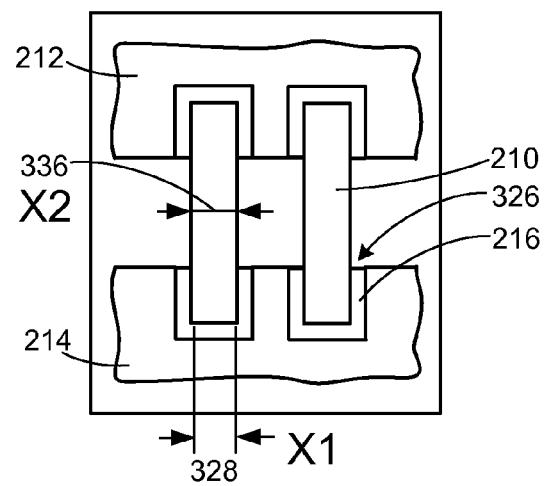

FIG. 3D shows the structure of FIG. 3C cooled forming the thermo-mechanical interlocking substrates with the top substrate 212 and the bottom substrate 214 without a separate bonding material, such as a solder material or conductive paste. The structure of FIG. 3C may be cooled down to room temperature to achieve tight mechanical bond and electrical connections with the expanded receptors 334 of FIG. 3C resized to the nominal receptors 216 have the nominal opening diameter 328 of the nominal openings 326. The thermal contraction of the expanded receptors 334 forms a tight bond with the conductive posts 210 since the contraction of the expanded receptors 334 is larger than that of the conductive posts 210 (X1<X2). The nominal opening diameter 328 is less than, for example 5% less than, the post diameter 336 and the insertion opening diameter 332 of FIG. 3C or X1<X2<X1+ΔX1.

If sufficiently different materials are used for the conductive posts 210 and the nominal receptors 216 of the bottom substrate 214, substrate level gravimetric placement and settling is also possible during reflow of the external interconnects 222 of FIG. 2. For example, the thermal expansion of the conductive posts 210 may be less than the thermal expansion of the bottom substrate 214 and the nominal receptors 216. The adhesive 218 of FIG. 2 can also be used to bond the top integrated circuit package system 204 of FIG. 2 and the bottom integrated circuit package system 206 of FIG. 2 together during placement of the top integrated circuit package system 204 to provide a more robust finished package.

Referring now to FIGS. 4A-4D, therein are cross-sectional views of different receptors, which may be used in various embodiments of the present invention. The receptors depicted in FIGS. 4A-4D may be used in the bottom substrate 214 of FIG. 2 or the top substrate 212 of FIG. 2 for forming the integrated circuit package system 100 of FIG. 2. Various other receptor shapes will be evident from the examples shown.

FIG. 4A depicts a top-narrowing conical receptor 402 where the lower portion of the top-narrowing conical receptor 402 has a base diameter 404 which is larger than the top portion of the top-narrowing conical receptor 402 with a top diameter 406. The top portion ensure the mechanical connection between the top-narrowing conical receptor 402 and the conductive posts 210 of FIG. 2 while allowing expansion room at the lower portion thereby reducing cracking or damage to the bottom substrate 214 of FIG. 2.

FIG. 4B depicts a center-narrowing cylindrical receptor 408 where the middle portion of the center-narrowing cylindrical receptor 408 has a narrow diameter 410 which is less than the diameter at the lower portion and top portion of the center-narrowing cylindrical receptor 408. The middle portion ensure the mechanical connection between the center-narrowing cylindrical receptor 408 and the conductive posts 210 of FIG. 2 while allowing expansion room at the lower portion and the top portion thereby reducing cracking or damage to the bottom substrate 214 of FIG. 2.

FIG. 4C depicts an inside serrated receptor 412 where the interior portion of the inside serrated receptor 412 includes serrations 414 and grooves 416. The inside serrated receptor 412 provides the intermetallic compound (IMC) layer to be distributed between the inside serrated receptor 412 and the conductive posts 210 of FIG. 2 forming the robust mechanical bond while distributing the brittle properties of the IMC layers.

FIG. 4D depicts a top-widening conical receptor 418 with the top portion, having a widened opening diameter 420, wider than the middle and lower portion. The progressively narrowing of the top-widening conical receptor 418 from the top portion towards the lower portion may serve to guide the conductive posts 210 of FIG. 2 alleviating alignment precision.

Referring now to FIG. 5, therein is shown a cross-sectional view of an integrated circuit package system 500 in a second embodiment of the present invention. The integrated circuit package system 500 may be an intermediate step of forming the integrated circuit package system 100 of FIG. 2 without singulation. The integrated circuit package system 500 includes a top integrated circuit package system 504, such as a packaged device with one or more integrated circuit or flip chip, mounted over a bottom integrated circuit package system 506, such as a packaged device with one or more integrated circuit or flip chip. The integrated circuit package system 500 includes thermo-mechanical interlocking substrates with an interconnect system 508. The interconnect system 508 includes conductive posts 510 locking a top substrate 512 of the top integrated circuit package system 504 and a bottom substrate 514 of the bottom integrated circuit package system 506.

Thermal expansion mismatch between the conductive posts 510 of the top integrated circuit package system 504 and nominal receptors 516 of the bottom integrated circuit package system 506 forms mechanical bonding between the conductive posts 510 and the nominal receptors 516. The nominal receptors 516 are shown not traversing through the bottom substrate 514. An adhesive 518, such as a film adhesive, attaches a bottom encapsulation 520, such as an epoxy molded compound, of the bottom integrated circuit package system 506 and the top substrate 512.

The number of the interconnect system 508 between the top integrated circuit package system 504 and the bottom integrated circuit package system 506 is shown extending across the bottom substrate 514. This may cause alignment and mechanical tolerance issues to align the conductive posts 510 over and into the nominal receptors 516.

External interconnects 522, such as solder balls, may be attached to the bottom of the bottom substrate 514 for connections to the next system level (not shown), such as a printed circuit board or another integrated circuit package system.

Figure 6A:
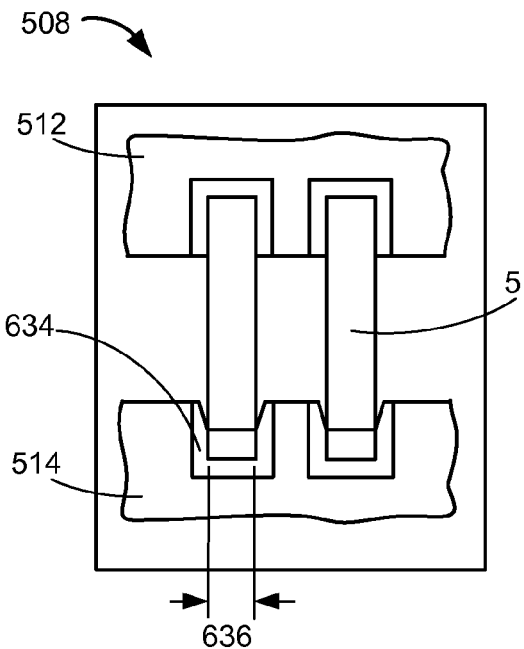
FIGS. 6A-6C are more detailed cross-sectional views of the interconnect system of the integrated circuit package system of FIG. 5.
Figure 6B:
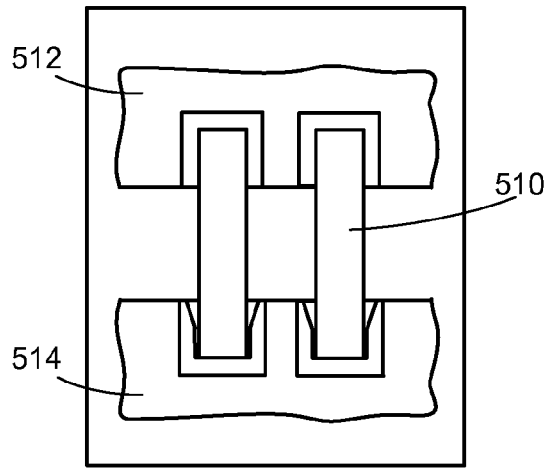
Figure 6C:
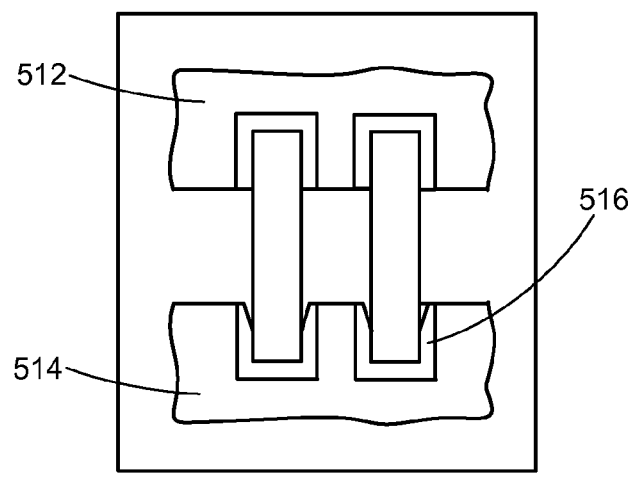

Referring now to FIGS. 6A-6C, therein more detailed cross-sectional views of the interconnect system 508 of the integrated circuit package system 500 of FIG. 5. FIG. 6A depicts the top substrate 512 having the conductive posts 510 being inserted into expanded receptors 634 of the bottom substrate 514. The expanded receptors 634 may be thermally expanded as described in FIG. 3B. The expanded receptors 634 are shown in the similar configuration as the top-widening conical receptor 418 of FIG. 4D. A widened opening diameter 636 of the expanded receptors 634 may serve to assist guiding the conductive posts 510 into the expanded receptors 634 thereby easing the alignment precision. The conductive posts 510 may be inserted into the expanded receptors 634 in the bottom substrate 514 without attaching or reflowing the external interconnects 522 of FIG. 5 to the bottom substrate 514.

FIG. 6B shows the gravimetric settling of the top substrate 512 with the conductive posts 510 in the bottom substrate 514 at the peak reflow temperature for attaching the external interconnects 522 of FIG. 5.

FIG. 6C shows the structure of FIG. 6B undergoing cooling form the reflow temperature to room temperature. The cooling process forms the thermo-mechanical interlocking substrates with solid interconnection between the top substrate 512 and the bottom substrate 514 resulting from the solid connection of the conductive posts 510 in the nominal receptors 516.

Referring now to FIGS. 7A-7D, therein are shown more detailed cross-sectional views of an interconnect system 700 of a third embodiment of the present invention. The interconnect system 700 may form the thermo-mechanical connections for the integrated circuit package system 100 of FIG. 2 or the integrated circuit package system 500 of FIG. 5.

Figure 7A:
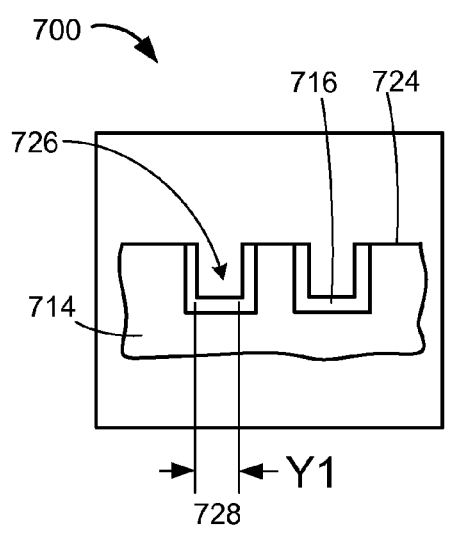
FIGS. 7A-7D are more detailed cross-sectional views of an interconnect system of a third embodiment of the present invention.

FIG. 7A depicts a portion of a bottom substrate 714. A mounting side 724 of the bottom substrate 714 exposes nominal receptors 716. Nominal openings 726 of the nominal receptors 716 in the bottom substrate 714 can be formed through a number of processes, such as the process of forming vias in a substrate. The nominal openings 726 of the nominal receptors 716 have a nominal opening diameter 728 denoted as "Y1", for example at room temperature.

Figure 7B:
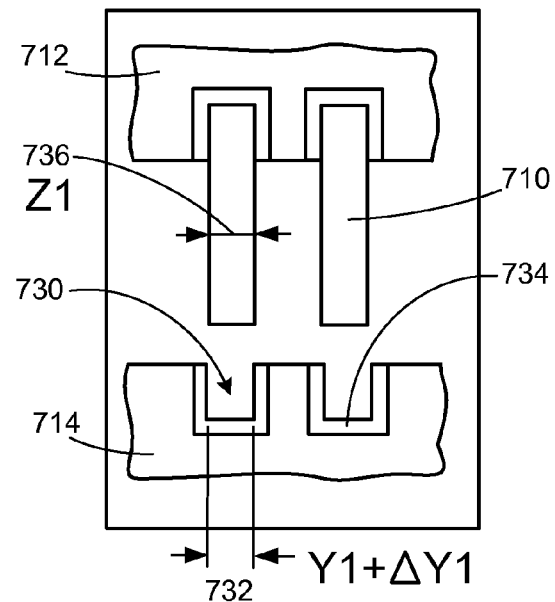

FIG. 7B depicts a portion of a top substrate 712 with conductive posts 710 above the bottom substrate 714. The bottom substrate 714 undergoes heating to a sufficient temperature to achieve thermal expansion $\Delta Y1$ of the nominal openings 726 of FIG. 7A to an expanded opening 730 having an insertion opening diameter 732. The heating form expanded receptors 734 from the nominal receptors 716 of FIG. 7A. The conductive posts 710 have a nominal post diameter 736 denoted as "Z1". The conductive posts 710 are aligned over the expanded receptors 734. The insertion opening diameter 732 is denoted as "Y1+$\Delta$Y1". The nominal post diameter 736 is smaller than the insertion opening diameter 732 or Z1<Y1+$\Delta$Y1.

A mechanical interconnect is achieved with reflow, such as solder ball reflow, of the whole module assembly, such as the integrated circuit package system 100 or the integrated circuit package system 500, by using materials of the conductive posts 710 and the nominal receptor 716 with sufficiently different thermal expansion.

Figure 7C:
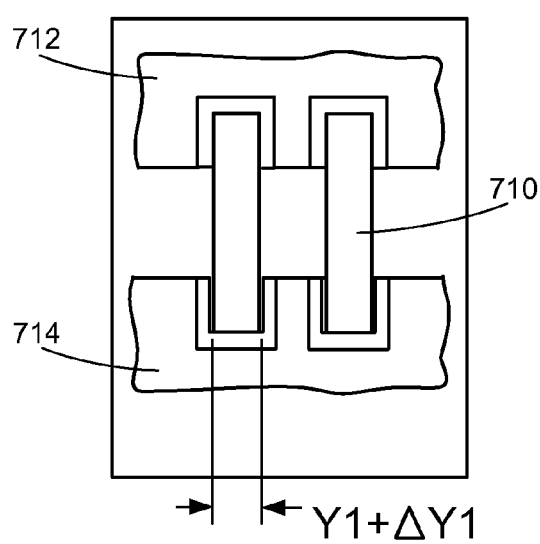

FIG. 7C depicts the top substrate 712 over the bottom substrate 714 with the conductive posts 710 in the bottom substrate 714. The width/diameter of the conductive posts 710 (Z1(T$_{room\ temp.}$)+$\Delta$Z1(T$_{hi.temp.}$)) should be smaller than the width/diameter of the receptors at the placement temperature but larger than the width/diameter of the receptors at room temperature (Y1<(Z1+$\Delta$Z1)<(Y1+$\Delta$Y1)). The placement tool (not shown) is preferably air or water cooled during placement to maintain constant width/diameter of the conductive posts 710.

Figure 7D:
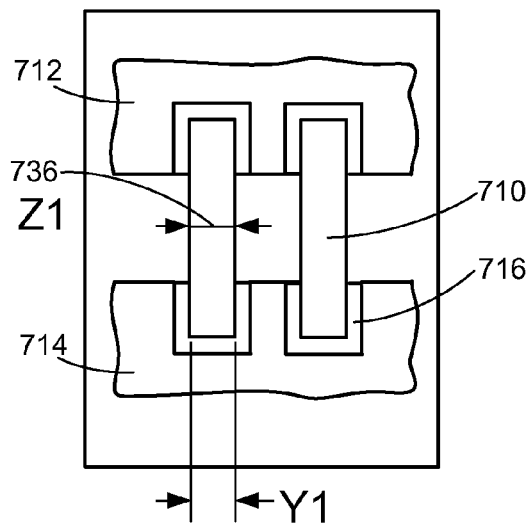

FIG. 7D depicts the top substrate 712 over the bottom substrate 714 in a thermo-mechanical interlocking substrates with the conductive posts 710 in the bottom substrate 714 without a separate bonding material, such as a solder material or conductive paste. The package assembly, such as the integrated circuit package system 100 of FIG. 2 or the integrated circuit package system 500 of FIG. 5, is preferably cooled to room temperature. The thermal contraction of the nominal receptors 716 make a tight bond with the conductive posts 710 since the contraction of the nominal receptors 716 is larger than that of the conductive posts 710 (Z1<Y1).

Figure 8:
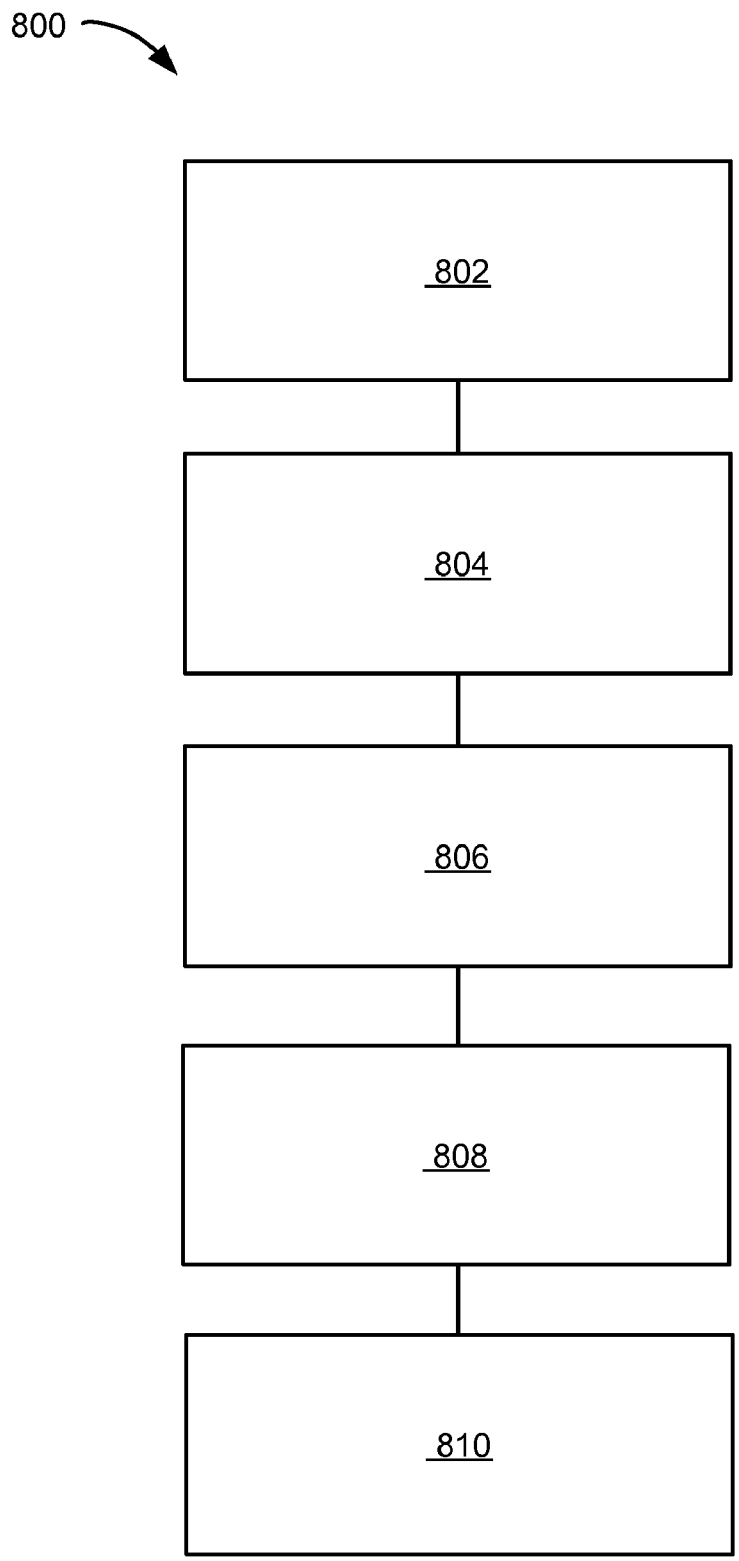
FIG. 8 is a flow chart of an integrated circuit package system for manufacturing of the integrated circuit package system in an embodiment of the present invention.

Referring now to FIG. 8, therein is shown a flow chart of an integrated circuit package system 800 for manufacturing of the integrated circuit package system 100 in an embodiment of the present invention. The system 800 includes providing a plurality of substrates in a block 802; inserting a receptor in one of the substrates, the receptor held in and not extending through the one of the substrates in a block 804; inserting a conductive post in another of the substrates in a block 806; mounting the one of the substrates and the another of the substrates over one another with the conductive post engaging the receptor to thermally interlock without a separate bonding material in a block 808; and mounting an integrated circuit mounted on the one of the substrates or the another of the substrates in a block 810.

These and other valuable aspects of the present invention consequently further the state of the technology to at least the next level.

Thus, it has been discovered that the integrated circuit package-on-package stacking system of the present invention furnishes important and heretofore unknown and unavailable solutions, capabilities, and functional aspects for developing and manufacturing package-on-package stacked solutions. The resulting processes and configurations are straightforward, cost-effective, uncomplicated, highly versatile and effective, can be surprisingly and unobviously implemented by adapting known technologies, and are thus readily suited for efficiently and economically manufacturing package-on-package stacked devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit package system comprising:
   providing a plurality of substrates;
   inserting a receptor in one of the substrates, the receptor held in and not extending through the one of the substrates;
   inserting a conductive post in another of the substrates;
   mounting the one of the substrates and the another of the substrates over one another with the conductive post engaging the receptor to thermally interlock without a separate bonding material; and
   mounting an integrated circuit mounted on the one of the substrates or the another of the substrates.

2. The system as claimed in claim 1 wherein inserting the receptor in one of the substrates includes inserting the receptor in a polymeric substrate.

3. The system as claimed in claim 1 wherein mounting the one of the substrates and the another of the substrates over one another with the conductive post engaging the receptor includes:
   forming the conductive post having a post diameter; and
   forming the receptor having an opening diameter with the post diameter greater than the opening diameter.

4. The system as claimed in claim 1 wherein mounting the one of the substrates and the another of the substrates over one another with the conductive post engaging the receptor to thermally interlock without a separate bonding material includes reflowing an external interconnect to the bottom substrate.

5. The system as claimed in claim 1 wherein:
   providing the plurality of the substrates includes:
      providing a bottom integrated circuit package system having a bottom encapsulation over the one of the substrates; and
   mounting the one of the substrates and the another of the substrates over one another includes:
      attaching an adhesive between the substrates.

6. An integrated circuit package system comprising:
   providing a plurality of integrated circuit package systems each having a substrate;
   inserting a receptor in the substrate of one of the integrated circuit package systems, the receptor held in and not extending through the substrate;
   inserting a conductive post in the substrate of another of the integrated circuit package systems; and
   mounting the one of the integrated circuit package systems and the another of the integrated circuit package systems over one another with the conductive post engaging the receptor to thermally interlock without a separate bonding material.

7. The system as claimed in claim 6 wherein inserting the receptor includes inserting the receptor comprised of oxidation resistant conductive material.

8. The system as claimed in claim 6 wherein mounting the one of the integrated circuit package systems and the another of the integrated circuit package systems over one another with the conductive post engaging the receptor includes heating the substrate with the receptor expanding to an expanded receptor having an insertion diameter and the conductive post having a post diameter less than the insertion diameter.

9. The system as claimed in claim 6 wherein inserting the receptor includes inserting the receptor in a configuration of a top-narrowing conical, center-narrowing cylindrical, inside serrated, and top-widening conical.

10. The system as claimed in claim 6 wherein mounting the one of the integrated circuit package systems and the another of the integrated circuit package systems over one another includes reflowing a solder ball to the one of the substrates.

11. An integrated circuit package system comprising:
a plurality of substrates;
a receptor in one of the substrates, the receptor held in and not extending through the one of the substrates;
a conductive post in another of the substrates with the one of the substrates over the another of the substrates with the conductive post thermally interlocked with the receptor without a separate bonding material; and
an integrated circuit mounted on the one of the substrates or the another of the substrates.

12. The system as claimed in claim 11 wherein the receptor is in a polymeric substrate.

13. The system as claimed in claim 11 wherein:
the conductive post has a post diameter; and
the receptor has an opening diameter with the post diameter greater than the opening diameter.

14. The system as claimed in claim 11 further comprising an external interconnect attached to the bottom substrate.

15. The system as claimed in claim 11 wherein:
the plurality of the substrates includes:
a bottom integrated circuit package system having a bottom encapsulation over the one of the substrates; and
the one of the substrates and the another of the substrates over one another include:
an adhesive between the substrates.

16. The system as claimed in claim 11 wherein the plurality of the substrates includes a plurality of integrated circuit package systems each having a substrate.

17. The system as claimed in claim 16 wherein the receptor is comprised of oxidation resistant conductive material.

18. The system as claimed in claim 16 wherein the one of the integrated circuit package systems having the conductive post is over the another of the integrated circuit package systems having the receptor thermo-mechanically interlocked with the conductive post in the receptor.

19. The system as claimed in claim 16 wherein the receptor includes a top-narrowing conical receptor, center-narrowing cylindrical receptor, inside serrated receptor, and top-widening conical receptor.

20. The system as claimed in claim 16 further comprising a solder ball attached to the one of the substrates.

* * * * *